United States Patent
Reisinger et al.

[11] Patent Number: 6,133,126
[45] Date of Patent: Oct. 17, 2000

[54] METHOD FOR FABRICATING A DOPANT REGION

[75] Inventors: Hans Reisinger, Grünwald; Martin Franosch, München; Herbert Schäfer, Höhenkirchen-Sieg. Brunn; Reinhard Stengl, Stadtbergen; Volker Lehmann; Gerrit Lange, both of München; Hermann Wendt, Grasbrunn, all of Germany

[73] Assignee: Siemens Aktiengesellschaft, Munich, Germany

[21] Appl. No.: 09/398,688

[22] Filed: Sep. 20, 1999

[30] Foreign Application Priority Data

Sep. 18, 1997 [DE] Germany .................. 198 42 822

[51] Int. Cl.⁷ .................................................. H01L 21/22
[52] U.S. Cl. ................................... 438/564; 438/542
[58] Field of Search ........................... 438/542, 564, 438/558, 795, 138

[56] References Cited

U.S. PATENT DOCUMENTS 6,017,778  1/2000  Pezzani ........................... 438/138

FOREIGN PATENT DOCUMENTS

0480178A2  4/1992  European Pat. Off. .

Primary Examiner—David Nelms
Attorney, Agent, or Firm—Herbert L. Lerner; Laurence A. Greenberg; Werner H. Stemer

[57] ABSTRACT

A method for fabricating a dopant region is disclosed. The dopant region is formed by providing a semiconductor substrate that has a surface. An electrically insulating intermediate layer is applied to the surface. A doped semiconductor layer is then applied to the electrically insulating intermediate layer, the semiconductor layer being of a first conductivity type and contains a dopant of the first conductivity type. A temperature treatment of the semiconductor substrate at a predefined diffusion temperature is performed, so that the dopant diffuses partially out of the semiconductor layer through the intermediate layer into the semiconductor substrate and forms there a dopant region of the first conductivity type. The electrical conductivity of the intermediate layer is modified, so that an electrical contact between the semiconductor substrate and the semiconductor layer is produced through the intermediate layer.

8 Claims, 4 Drawing Sheets

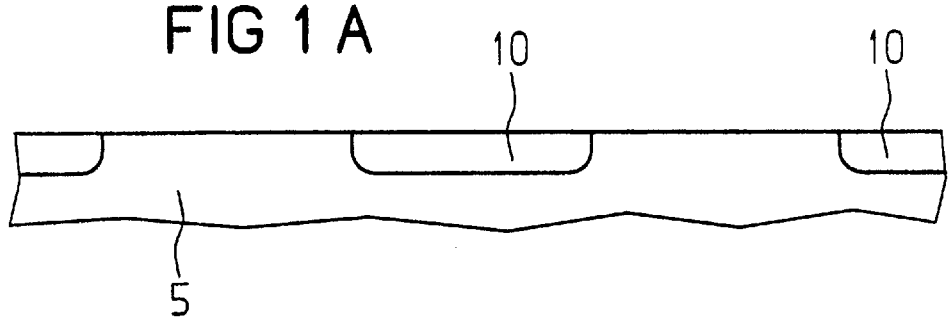
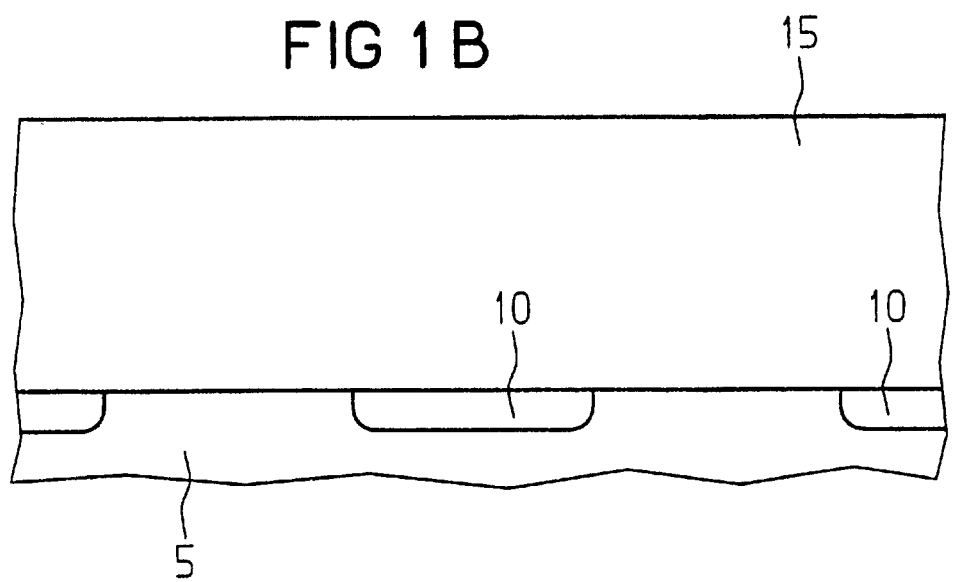
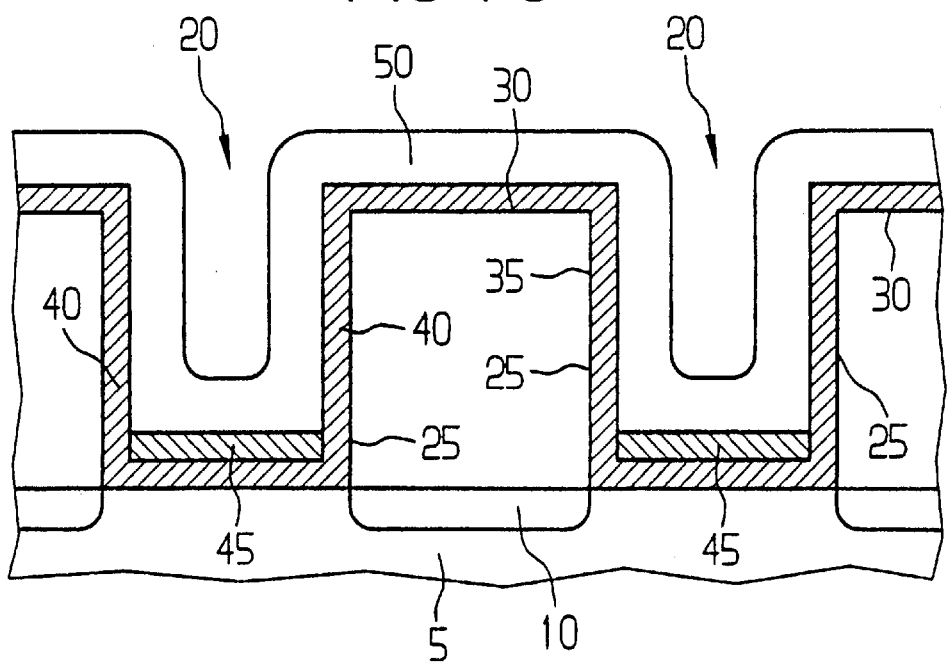

METHOD FOR FABRICATING A DOPANT REGION

BACKGROUND OF THE INVENTION

Field of the Invention

When integrated circuits are fabricated, a plurality of components are formed in a semiconductor substrate. This is typically carried out by doping certain areas of the semiconductor material, which is, as a rule, of one conductivity type. By performing a plurality of such dopant steps, MOS transistors or diodes, for example are fabricated. In the process, masks for covering regions that are not to be doped frequently have to be used, the masks leading to an increase in the number of process steps. When contact is subsequently made with the dopant regions that are produced, further masks are necessary.

One possible way of producing dopant regions is described, for example, in Published, European Patent Application EP 0 480 178 A2. In the publication, a so-called tunnel oxide is deposited on a silicon substrate and a polysilicon layer, which is subsequently doped in a suitable way, is deposited on the tunnel oxide. Under the effect of high temperatures, the dopants which are implanted into the polysilicon layer subsequently pass by diffusion through the tunnel oxide into the silicon substrate and form a dopant region there. There is no provision for contact to be made with the dopant region.

SUMMARY OF THE INVENTION

It is accordingly an object of the invention to provide a method for fabricating a dopant region which overcomes the above-mentioned disadvantages of the prior art methods of this general type, in which the fabrication process is simplified.

With the foregoing and other objects in view there is provided, in accordance with the invention, a method for fabricating a dopant region, which includes:
providing a semiconductor substrate having a surface;
applying an electrically insulating intermediate layer to the surface of the semiconductor substrate;
applying of a doped semiconductor layer to the electrically insulating intermediate layer, the doped semiconductor layer being of a first conductivity type and containing a dopant of the first conductivity type;
performing a temperature treatment of the semiconductor substrate at a predefined diffusion temperature, so that the dopant diffuses at least partially out of the doped semiconductor layer through the electrically insulating intermediate layer into the semiconductor substrate and forms there at least one dopant region of the first conductivity type; and
modifying an electrical conductivity of the electrically insulating intermediate layer, so that an electrical contact between the at least one dopant region and the doped semiconductor layer being produced through the electrically insulating intermediate layer.

An essential idea of the invention is that the dopant region is formed self-aligned in the semiconductor substrate. For this purpose, a semiconductor substrate on which a semiconductor layer of the first conductivity type is disposed is subjected to a temperature treatment step. The dopants of the first conductivity type which are contained in the semiconductor layer diffuse through the intermediate layer into the semiconductor substrate during the temperature treatment step, and form at least one dopant region of the first conductivity type in the substrate. The temperature treatment or the diffusion step is carried out here over a predetermined period of time and at a predefined diffusion temperature. The period of time and the diffusion temperature are preferably matched to one another here in such a way that the dopant region is formed to a desired depth in the semiconductor substrate. Subsequent modification of the electrical conductivity of the intermediate layer makes it possible to make contact with the dopant region as a final step. An electrical contact between the dopant region and the semiconductor layer is thus produced through the intermediate layer, which was initially an insulating layer. If the semiconductor substrate is of the same dopant type as the dopant region, the process of making contact with the dopant region also advantageously results in contact also being made with the semiconductor substrate at the same time.

The modification of the conductivity of the intermediate layer can be brought about, for example, by the effect of an electrical field. For this purpose, an electrical field of sufficient strength, by which an electrical breakdown of the intermediate layer is achieved, is built up over the intermediate layer.

One advantage of the invention is that contact can be made with the dopant region or the semiconductor substrate selectively at regions that are provided for this. An additional etching step for defining contact regions is dispensed with.

If the semiconductor substrate is itself of a conductivity type, for example a second conductivity type which is opposite to the first conductivity type, the formation of the dopant region results in a direct interface between the two conductivity types in the semiconductor substrate, which junction, as a diode junction, unidirectionally blocks a flow of current.

The intermediate layer is preferably composed of an oxide, the oxide being capable of being changed from its insulating state into a conductive state by use of a suitable current pulse. The diffusion temperature at which the temperature treatment of the semiconductor substrate is carried out is above 600° C., preferably above 800° C. The higher the diffusion temperature, the quicker the dopant region forms. A diffusion temperature of approximately 1000° C. is particularly favorable.

The method is thus generally suitable for forming dopant regions in the semiconductor substrate. One advantage of the invention is that the dopant region is formed self-aligned with respect to the semiconductor layer. Additional mask steps are not necessary.

It is advantageous to structure the semiconductor layer suitably before the temperature treatment. As a result, on the one hand the dopant region forms only in predefined regions in the semiconductor substrate. On the other hand, the semiconductor layer can be suitably structured in the form of conductor tracks or address lines. As a result, a structure is produced in which dopant regions with which contact is made are provided at predetermined regions.

The semiconductor layer can also preferably be used at the same time for making contact with the dopant region. For this purpose, it is necessary to change the intermediate layer into a conductive state. In particular in the case of semiconductor layers made of oxides, this can be carried out by a targeted current surge. Here, conductive paths, via which the electrical contact between the semiconductor layer and the dopant region is produced, are formed in the oxide.

Oxides, for example gate oxides, have relatively defined breakdown voltages so that by applying a suitably dimensioned voltage it is possible to make the intermediate layer conductive. The level of the applied voltage or of the electrical field strength that acts on the intermediate layer depends, inter alia, on the thickness of the intermediate layer. In order to avoid excessively high voltages, and thus high power losses, it is recommended to make the intermediate layer sufficiently thin. A preferred oxide is, for example, silicon dioxide ($SiO_2$). When the oxide is intact, the applied voltage drops essentially over the intact oxide. In contrast to this, when the oxide is electrically broken down, its resistance should have a significantly lower value and provide good ohmic contact between the dopant region and the semiconductor Layer. If the specific resistance of the oxide which IS used is, for example, $10^{12}$ Ω/cm, a 10 nm thick oxide has a resistance of $10^6$ Ω.

It has proven advantageous to fabricate the semiconductor layer from polysilicon which is doped in situ with a dopant content between $10^{20}/cm^3$ and $10^{22}/cm^3$. The dopants used are, for example, arsenic or phosphorus for n-type doping. Of course, the semiconductor layer can also have p-type doping.

The high dopant content ensures, on the one hand, good conductivity of the polysilicon. On the other hand, the high dopant content in the semiconductor layer makes a large reservoir of dopants available that can be used to form the dopant region. The dopants contained in the semiconductor layer diffuse, for example activated by the thermal process, into the semiconductor substrate to a specific degree and form the dopant region there.

It is favorable to carry out the temperature treatment at temperatures 800° C., preferably at 1000° C.

Other features which are considered as characteristic for the invention are set forth in the appended claims.

Although the invention is illustrated and described herein as embodied in a method for fabricating a dopant region, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 1a to 1h are fragmentary, sectional views of a memory cell array which show the method steps for fabricating dopant regions according to the invention.

Figure 1D:
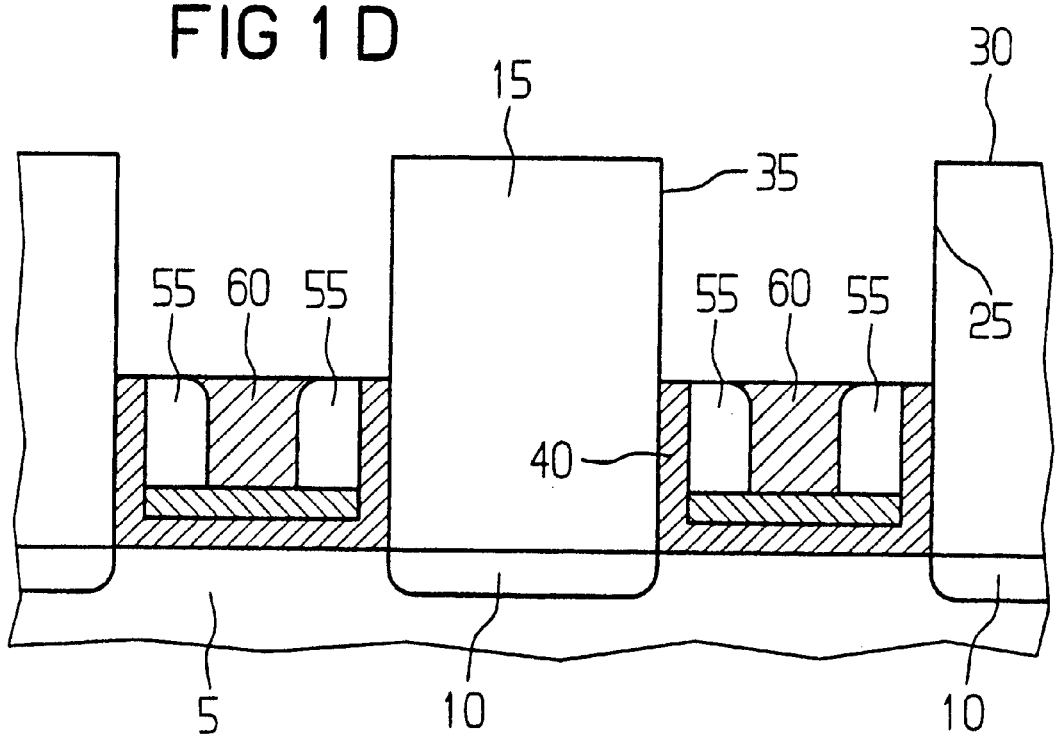

DESCRIPTION OF THE PREFERRED
EMBODIMENTS

In all the figures of the drawing, sub-features and integral parts that correspond to one another bear the same reference symbol in each case. Referring now to the figures of the drawing in detail and first, particularly, to FIG. 1a thereof, there is shown the method according to the invention which will be described with reference to the fabrication of a memory cell array. In order to fabricate such a memory cell array, firstly a basic substrate 5 with insulation regions 10 that are already integrated is prepared. The size and lateral spacing of the insulation regions 10 are matched to a structure that is to be formed subsequently.

Then, a semiconductor substrate 15 that is already doped, preferably silicon, is deposited epitaxially onto the basic substrate 5 (FIG. 1b). Subsequently, trenches 20 are etched into the semiconductor substrate 15 by a suitable mask technique (FIG. 1c). Side walls 25 and an upper side 30 of the trenches 20 constitute, in what follows, a surface 35 of the semiconductor substrate 15. A conformal and electrically insulating intermediate layer 40 is then applied to the surface 35. If appropriate, a CVD oxide 45, preferably TEOS, is deposited in a lower region of the trenches 20 after this step.

The electrically insulating intermediate layer 40 is preferably composed of silicon dioxide ($SiO_2$) and is applied, by a chemical vapor deposition (CVD) process, to the surface with a material thickness between 3 and 20 nm, preferably between 4 and 10 nm.

Figure 1E:
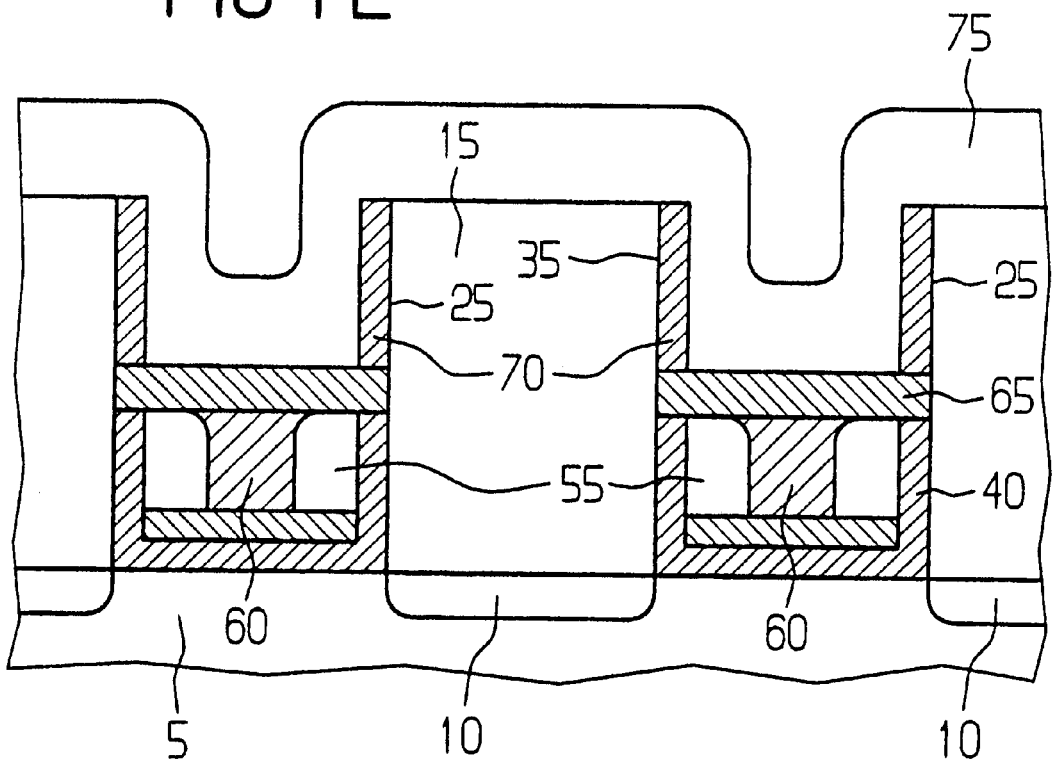

This is followed by the conformal application of a doped semiconductor layer 50 to the intermediate layer 40, the doped semiconductor layer 50 being formed by a polysilicon layer 50 which is doped in situ with a dopant concentration of approximately $10^{20}/cm^3$ to $10^{22}/cm^3$. The polysilicon layer 50 has the opposite conductivity type to the conductivity type of the semiconductor substrate 15. The structure that is obtained is illustrated in FIG. 1c. The polysilicon layer 50 and the intermediate layer 40 are then etched back anisotropically approximately as far as half the height of the trenches 20 (FIG. 1d). As a result, lower address lines 55 and the intermediate layer 40 disposed between the lower address lines 55 and the side wall 25 are produced on the side walls 25 of each trench 20. The remaining cavities between the lower address lines 55 can be planarized with a thermal oxide 60. Subsequently, as illustrated in FIG. 1e, a further oxide 65 is applied to cover the lower address lines 55 and the intermediate layer 40.

Now, this is followed by the self-aligned formation of a further intermediate layer 70 on the side walls 25 in the upper region of the trench 20, to which intermediate layer 70 a further polysilicon layer 75 is applied. Preferably, as illustrated in FIG. 1e, the intermediate layer 70 is etched anisotropically before the actual application of the further polysilicon layer 75.

Figure 1F:
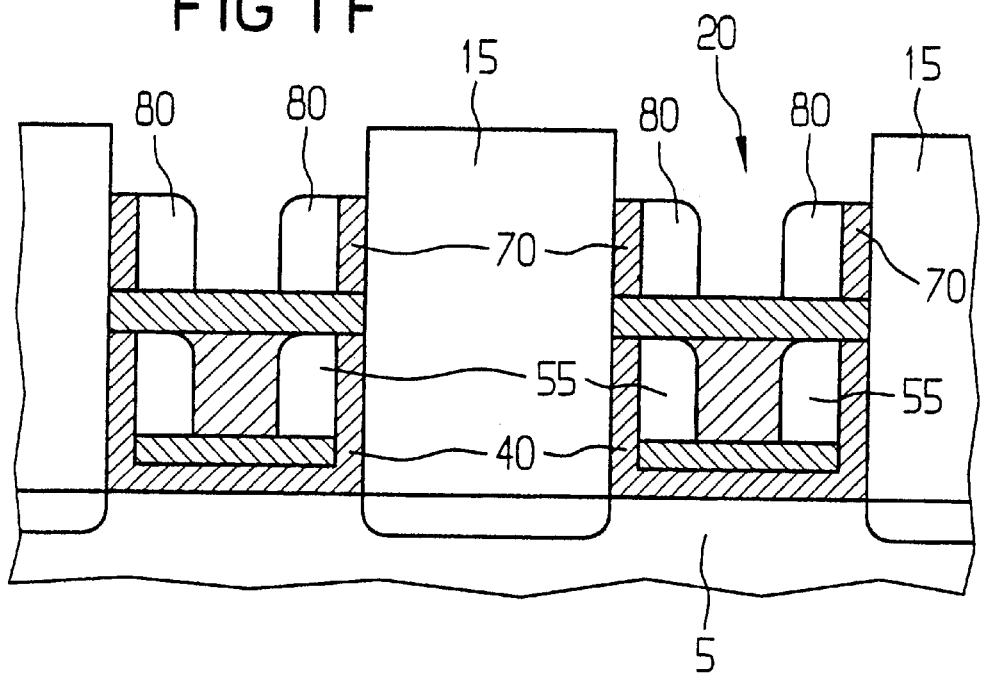

After anisotropic etching back of the polysilicon layer 75, upper address lines 80 have been produced in the upper part of the trench 20. The structure that is obtained is illustrated in FIG. 1f.

Figure 1G:
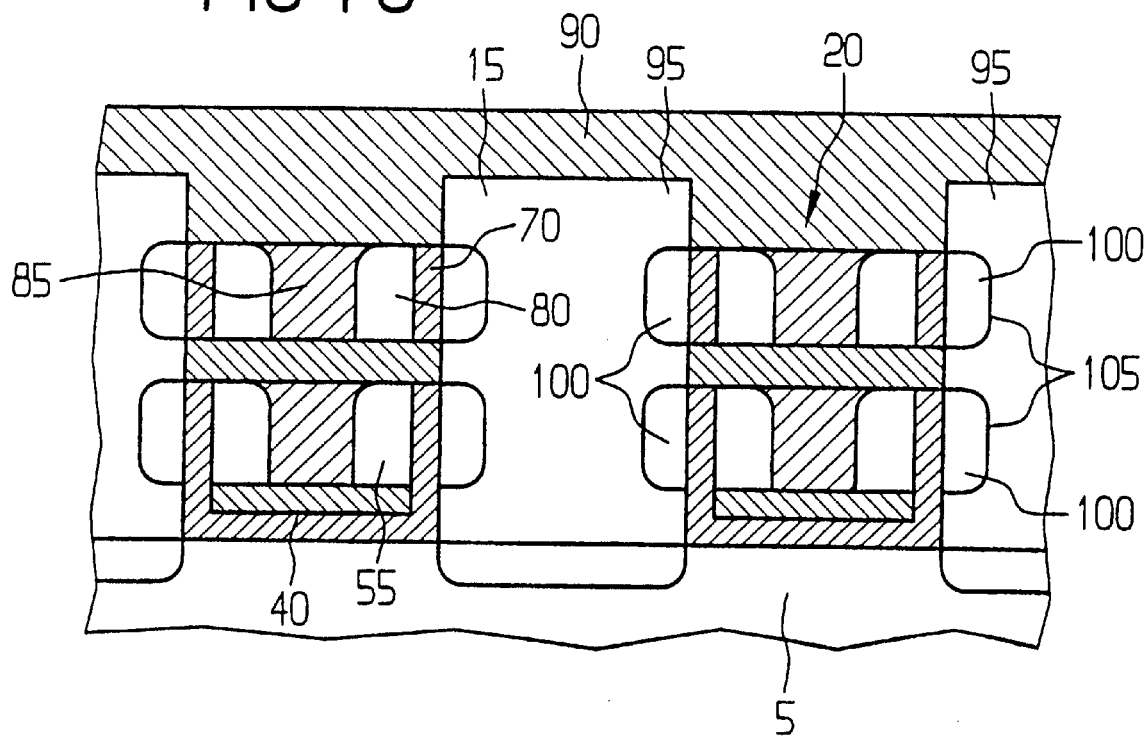

The remaining cavities are filled with an oxide 85 and with a planar insulating layer 90, the insulating layer 90 completely covering the trenches 20 and webs 95 disposed between the trenches 20 (FIG. 1g). By a thermal annealing step, the dopants contained in the lower and upper address lines 55, 80 are then activated and diffuse here through the intermediate layers 40 and 70 into the semiconductor substrate 15. In the process, the dopant regions 100, which are of an opposite conductivity type to that of the semiconductor substrate 15, are produced. A direct junction 105 that is formed here between the dopant regions 100 and the semiconductor substrate 15 acts as a blocking pn-type junction. Treatment for approximately 60 minutes at 1000° C. is necessary to form the first dopant regions 100 with an approximately 4 nm thick intermediate layer made of silicon dioxide ($SiO_2$). If the address lines 55 and 80 have, for example, a dopant concentration between $10^{21}$ and $10^{22}/cm^3$ given the above process parameters the dopant regions 100 extend approximately 30 to 50 nm into the semiconductor substrate 15, a drop in the dopant concentration by 3 decades in comparison with the dopant concentration in the address lines 55 and 80 having been set as the limit. These measurements were verified using secondary ion mass spectroscopy.

Figure 1H:
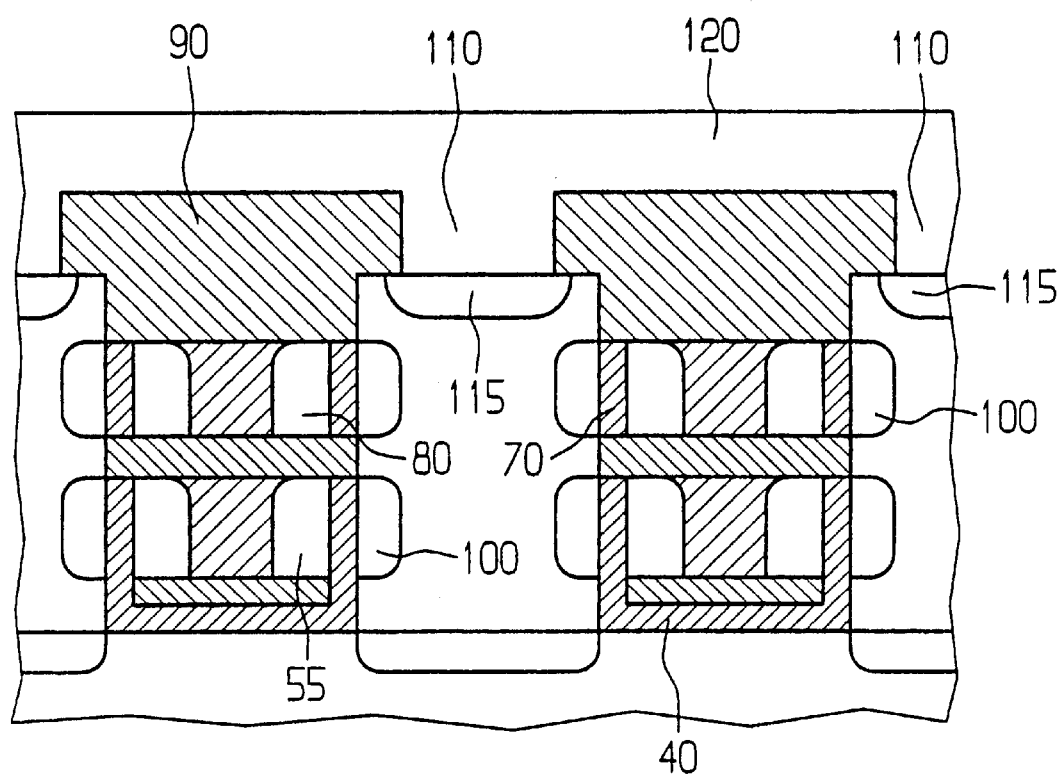

In a subsequent method step, contact holes 110 are formed in the insulating layer 90 (FIG. 1h). Contact can be made with the semiconductor substrate 15 on its upper side through the contact holes 110. In order to provide a contact which has as low a resistance as possible, the semiconductor substrate 15 is provided on its upper side with a highly doped contact region 115, which is of the same conductivity type as the semiconductor substrate 15. The formation of the contact regions 115 is preferably carried out by ion implantation through the contact holes 110. As a result, no further masks are required. The contact holes 110 are subsequently filled with a conductive material. For this purpose, further address lines 120, which simultaneously fill the contact holes 110 here and thus make contact with the semiconductor substrate 15 via the contact regions 115, are preferably applied to the insulating layer 90.

According to requirements, the intermediate layers 40 and 70 can subsequently be modified in terms of their conductivity by electrical breakdown. For this purpose, a sufficiently dimensioned electrical field is applied, for example by applying a voltage of 10 V. The given intermediate layers 40 and 70 made of silicon dioxide with a thickness of 10 nm (resulting field strength 10 MV/cm), a current of approximately 1 mA/cm$^2$ flows. The flow of current is increased in each case by a decade per 1 V. Thus, it takes a period of approximately 1000 sec to burn through the intermediate layer at 10 V, or 1 msec at 16 V. At the same time it is possible to store data in the intermediate layers 40 and 70. Thus, an insulating intermediate layer represents, for example, a logic 0, while an electrically broken-down, and thus conductive oxide represents a logic 1.

Simple contacts can also be fabricated by the method according to the invention. It is thus possible for highly doped dopant regions to serve as an ohmic contact for making contact with the semiconductor substrate. In this case, the dopant regions and the semiconductor substrate are of the same conductivity type.

We claim:

1. A method for fabricating a dopant region, which comprises:

providing a semiconductor substrate having a surface;

applying an electrically insulating intermediate layer to the surface of the semiconductor substrate;

applying of a doped semiconductor layer to the electrically insulating intermediate layer, the doped semiconductor layer being of a first conductivity type and containing a dopant of the first conductivity type;

performing a temperature treatment of the semiconductor substrate at a predefined diffusion temperature, so that the dopant diffuses at least partially out of the doped semiconductor layer through the electrically insulating intermediate layer into the semiconductor substrate and forms there at least one dopant region of the first conductivity type; and modifying an electrical conductivity of the electrically insulating intermediate layer, so that an electrical contact between the at least one dopant region and the doped semiconductor layer being produced through the electrically insulating intermediate layer.

2. The method according to claim 1, which comprises forming the electrically insulating intermediate layer from an oxide.

3. The method according to claim 2, wherein the oxide is silicon dioxide.

4. The method according to claim 1, which comprises forming the doped semiconductor layer from polysilicon which is doped in situ with a dopant concentration of $10^{20}$/cm$^3$ to $10^{22}$/cm$^3$.

5. The method according to claim 1, which comprises performing the temperature treatment step with the diffusion temperature above 800° C.

6. The method according to claim 1, which comprises modifying the electrcial conductivity of the electrically insulating intermediate layer with a voltage pulse.

7. The method according to claim 1, which comprises modifying the electrical conductivity of the electrically insulating intermediate layer with a current pulse.

8. The method according to claim 1, which comprises forming the semiconductor substrate with a second conductivity type and a diode junction is defined there due to the at least one dopant region of the first conductivity type.

* * * * *